United States Patent
Ferrara et al.

(10) Patent No.: US 7,375,355 B2
(45) Date of Patent: May 20, 2008

(54) RIBBON BEAM ION IMPLANTER CLUSTER TOOL

(75) Inventors: Joseph Ferrara, Georgetown, MA (US); Patrick R. Splinter, Middleton, MA (US); Michael A. Graf, Belmont, MA (US); Victor M. Benveniste, Gloucester, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 204 days.

(21) Appl. No.: 11/432,977

(22) Filed: May 12, 2006

(65) Prior Publication Data

US 2007/0262271 A1 Nov. 15, 2007

(51) Int. Cl.
*H01J 37/317* (2006.01)

(52) U.S. Cl. ............... 250/492.21; 250/492.2; 250/492.1; 250/492.3

(58) Field of Classification Search ........... 250/492.21, 250/492.2, 492.1, 492.3
See application file for complete search history.

(56) References Cited

U.S. PATENT DOCUMENTS

| | | | |
|---|---|---|---|
| 4,276,477 A | 6/1981 | Enge | |
| 4,346,301 A * | 8/1982 | Robinson et al. | 250/492.2 |
| 4,800,100 A * | 1/1989 | Herbots et al. | 427/527 |
| 5,053,627 A | 10/1991 | Ruffell et al. | |
| 5,554,853 A | 9/1996 | Rose | |
| 6,207,005 B1 * | 3/2001 | Henley et al. | 156/345.32 |
| 6,677,599 B2 * | 1/2004 | Berrian | 250/492.3 |
| 6,833,552 B2 | 12/2004 | Berrian | |
| 6,900,444 B2 | 5/2005 | Ferrara et al. | |
| 2003/0122088 A1 * | 7/2003 | Sheng et al. | 250/492.21 |
| 2005/0092937 A1 * | 5/2005 | Tanaka | 250/492.2 |

* cited by examiner

*Primary Examiner*—Jack Berman
*Assistant Examiner*—Michael J Logie
(74) *Attorney, Agent, or Firm*—Eschweiler & Associates, LLC

(57) ABSTRACT

An ion implantation cluster tool for implanting ions into a workpiece is provided, wherein a plurality of beamline assemblies having a respective plurality of ion beamlines associated therewith are positioned about a common process chamber. Each of the plurality of ion beamline assemblies are selectively isolated from the common process chamber, and the plurality of beamline intersect at a processing region of the process chamber. A scanning apparatus positioned within the common process chamber is operable to selectively translate a workpiece holder in one or more directions through each of the plurality of ion beamlines within the processing region, and a common dosimetry apparatus within the common process chamber is operable to measure one or more properties of each of the plurality of ion beamlines. A load lock chamber is operably coupled to the common process chamber for exchange of workpieces between the common process chamber and an external environment.

20 Claims, 2 Drawing Sheets

RIBBON BEAM ION IMPLANTER CLUSTER TOOL

FIELD OF THE INVENTION

The present invention relates generally to an ion implantation system and method for implanting ions into a workpiece, and more specifically to a system having a plurality of ion beamline assemblies coupled to a common process chamber.

BACKGROUND OF THE INVENTION

In the manufacture of semiconductor devices, ion implantation systems are employed to dope a semiconductor wafer or other workpiece with impurities. In such systems, an ion source ionizes a desired dopant element, which is extracted from the source in the form of an ion beam. The ion beam is typically mass analyzed to select ions of a desired charge-to-mass ratio and then directed at the surface of a semiconductor wafer in order to implant the wafer with the dopant element. The ions of the beam penetrate the surface of the wafer to form a region of desired conductivity, such as in the fabrication of transistor devices in the wafer. A typical ion implanter includes an ion source for generating the ion beam, a beamline assembly including a mass analysis apparatus for mass resolving the ion beam using magnetic fields, and a target chamber containing the semiconductor wafer or workpiece to be implanted by the ion beam.

Typically, the ions generated from the ion source are formed into a beam and directed along a predetermined beam path to an implantation station. The ion beam implanter may further include beam forming and shaping structures extending between the ion source and the implantation station. The beam forming and shaping structures maintain the ion beam and bound an elongated interior cavity or passageway through which the beam passes en route to the implantation station. When operating the ion implanter, this passageway is typically evacuated to reduce the probability of ions being deflected from the predetermined beam path as a result of collisions with air molecules.

The mass of an ion relative to the charge thereon (i.e., charge-to-mass ratio) affects the degree to which it is accelerated both axially and transversely by an electrostatic or magnetic field. Therefore, the beam that reaches a desired area of a semiconductor wafer or other target can be made very pure since ions of undesirable molecular weight will be deflected to positions away from the beam and implantation of other than desired materials can be avoided. The process of selectively separating ions of desired and undesired charge-to-mass ratios is known as mass analysis. Mass analyzers typically employ a mass analysis magnet creating a dipole magnetic field to deflect various ions in an ion beam via magnetic deflection in an arcuate passageway that will effectively separate ions of different charge-to-mass ratios.

The ion beam is focused and directed at a desired surface region of the workpiece in the target station, wherein the energetic ions of the ion beam are accelerated to a predetermined energy level to penetrate into the bulk of the workpiece. The ions, for example, are embedded into the crystalline lattice of the material to form a region of desired conductivity, with the energy of the ion beam generally determining the depth of implantation. The ion beam may be a spot beam (e.g., a pencil beam), wherein the workpiece is mechanically scanned in two dimensions orthogonal to the generally stationary spot beam; a ribbon beam, wherein the beam is electromagnetically scanned in one direction across the workpiece while the workpiece is mechanically scanned in an orthogonal direction; or an electromagnetically scanned beam that is electromagnetically scanned in two directions across a stationary workpiece. Examples of ion implantation systems include those available from Axcelis Technologies of Beverly, Mass.

Conventionally, a typical ion implantation system comprises a processing chamber, wherein the workpiece resides on a workpiece holder within the processing chamber during implantation. The processing chamber maintains a processing environment that is typically separate from other environments, wherein cross-contamination from the processing environment to the other environments is generally limited. In an ion implantation system employing a mechanical scanning of the workpiece, the workpiece holder is typically coupled to a scanning device within the processing chamber, wherein the scanning device is operable to move the workpiece holder in one or more directions with respect to the ion beam. Further, a beam monitoring device (such as a Faraday cup) is typically aligned with the ion beam within the process chamber for process feedback.

In some processing schemes, cluster tools are utilized to perform several different processes on a single workpiece, wherein the workpiece is transported between various processing environments within the cluster tool. For example, FIG. 1 illustrates a conventional cluster tool 10, wherein the cluster tool is configured to perform a variety of processes on a workpiece 15. The cluster tool 10, for example, comprises a first ion implanter 20, a second ion implanter 25 an etch station 30, a resist asher 35, and a load lock chamber 40 surrounding a central workpiece transfer station 45. Each of the first ion implanter 20, second ion implanter 25, etch station 30, and resist asher 35 comprises its own respective independent processing chamber 50A-50D that is selectively isolated from the workpiece transfer station 45 by respective gate valves 55A-55D, wherein each processing chamber has an independent processing environment 60A-60D for processing the workpiece 15. Further, each processing chamber 50A-50D comprises its own workpiece holder 65A-65D, wherein, in the case of the first and second ion implanters 20 and 25, the workpiece holders 65A and 65B are further coupled to a respective first and second scanning device 70A and 70B. Still further, in the case of the first and second ion implanters 20 and 25, a respective first and second beam monitoring device 75A and 75B are positioned within the respective processing chambers 50A and 50B for monitoring respective first and second ion beamlines 80A and 80B associated with the respective implanter.

In operation, the workpiece 15 is conventionally transferred between the plurality of processing chambers 50A-50D by a workpiece handler 80, based on the desired processing of the workpiece. For example, when differing ion species are desired to be implanted into the workpiece 15, the first and second ion beamlines 85A and 85B of the respective first and second ion implanters 20 and 25 are configured to have differing ion species associated therewith. Accordingly, the workpiece 15 is transferred from the load lock chamber 40 through the gate valve 55A to the first processing chamber 50A and placed on the workpiece holder 65A coupled to the first scanning device 70A within the processing chamber 50A. The gate valve 55A is then closed, the first processing chamber 50A is evacuated, and the workpiece 15 is scanned through the first beamline 85A via the first scanning device 70A, wherein the first beamline is monitored by the first beam monitoring device 75A within the processing chamber 50A.

Once the desired implant by the first implanter 20 is complete, the gate valve 55A is opened, and the workpiece 15 is transferred out of the processing chamber 50A of the first implanter and back into the transfer station 45. The workpiece is 15 is then transferred through the gate valve 55B into the processing chamber 50B of the second implanter 25 and placed on the workpiece holder 65B coupled to the second scanning device 70B within the processing chamber 50B of the second implanter. The gate valve 55B is then closed, and the processing chamber 50B is evacuated. The workpiece 15 is then scanned through the second beamline 85B of the second implanter 25 via the second scanning device 70B, wherein the second beamline is monitored by the second beam monitoring device 75B within the processing chamber 50B. When the desired implant by the second implanter 25 is complete, the gate valve 55B is opened, and the workpiece 15 is transferred out of the processing chamber 50B of the second implanter and back into the transfer station 45, wherein further processing may or may not be performed.

The conventional cluster tool described above, however, is costly, since each ion implantation system 20 and 25 has its own respective dedicated process chamber 50A and 50B, scanning device 70A and 70B, beam monitoring device 75A and 75B, and typically, its own controller (not shown) for controlling each implantation system. Therefore, it is desirable to provide an improved ion implantation system cluster tool, wherein efficiencies can be increased by sharing common components between multiple ion beamlines, thus decreasing ownership costs associated with having multiple beamlines.

SUMMARY OF THE INVENTION

The present invention overcomes the limitations of the prior art by providing an ion implantation cluster tool, wherein a plurality of ion beamlines share components such as a common process chamber, scanning device, beam monitoring device, workpiece handling device, and controller. Consequently, the following presents a simplified summary of the invention in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

The present invention is directed generally toward an ion implantation cluster tool for implanting ions into a workpiece. In accordance with one aspect of the invention, a plurality of beamline assemblies having a respective plurality of ion beamlines associated therewith are positioned about a periphery of a common process chamber. The common process chamber, for example, is operable to be evacuated by one or more vacuum pumps. Each of the plurality of ion beamline assemblies, for example, are further selectively isolated from the common process chamber by one or more gate valves, wherein each beamline assembly is selectively isolated from a vacuum environment within the common process chamber.

In accordance with one exemplary aspect of the invention, the plurality of beamlines associated with the plurality of beamline assemblies intersect at a processing region of the process chamber. A scanning apparatus is positioned within the common process chamber, wherein the scanning apparatus is operable to selectively translate a workpiece holder holding a workpiece in one or more directions through each of the plurality of ion beamlines within the processing region. The scanning apparatus, for example, may comprise a robot having three or more degrees of freedom. Further, a two-dimensional scanning system may be further coupled to the scanning apparatus, wherein the two-dimensional scanning system is operable to perform a predetermined scanning of the workpiece through the selected ion beamline.

According to another exemplary aspect of the invention, a common dosimetry apparatus, such as a Faraday, is positioned within the common process chamber, wherein the common dosimetry apparatus is operable to measure one or more properties or characteristics of each of the plurality of ion beamlines. The common dosimetry apparatus, for example, may be operably coupled to the scanning apparatus. A load lock chamber is further provided, wherein the load lock chamber is operably coupled to the common process chamber for exchange of workpieces between the common process chamber and an external environment via a common workpiece handling device. Accordingly, the present invention provides a common process chamber, scanning apparatus, dosimetry apparatus, and workpiece handling device for a plurality of ion beamlines, thus providing a more efficient ion implantation cluster tool than previously seen.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
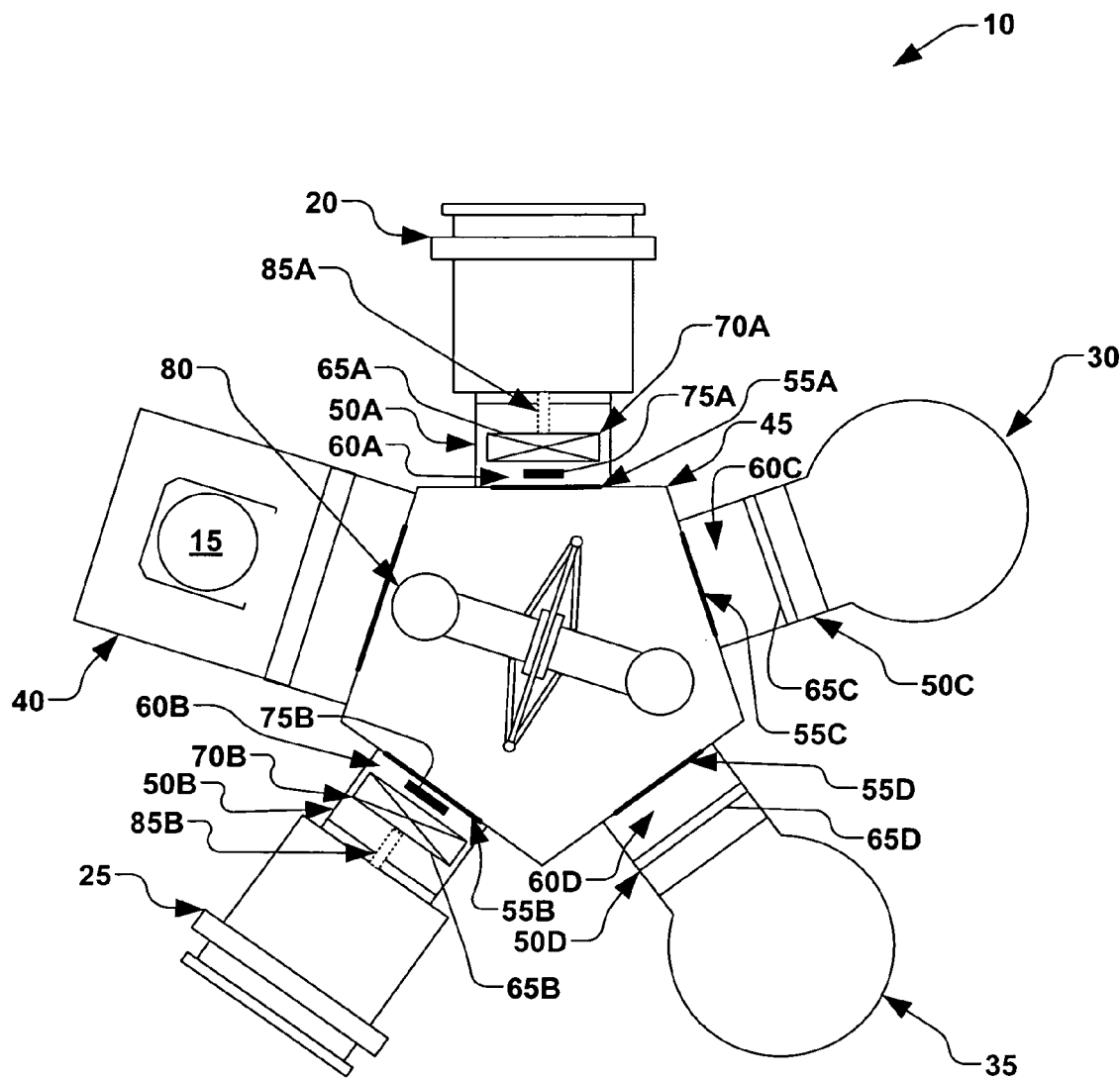
FIG. 1 is a plan view of a conventional cluster tool for processing a workpiece according to the prior art.

The present invention is directed generally towards a system for efficiently providing multiple ion beamlines to a common process chamber. Accordingly, the present invention will now be described with reference to the drawings, wherein like reference numerals may be used to refer to like elements throughout. It should be understood that the description of these aspects are merely illustrative and that they should not be interpreted in a limiting sense. In the following description, for purposes of explanation, numerous specific details are set forth in order to provide a thorough understanding of the present invention. It will be evident to one skilled in the art, however, that the present invention may be practiced without these specific details.

Figure 2:
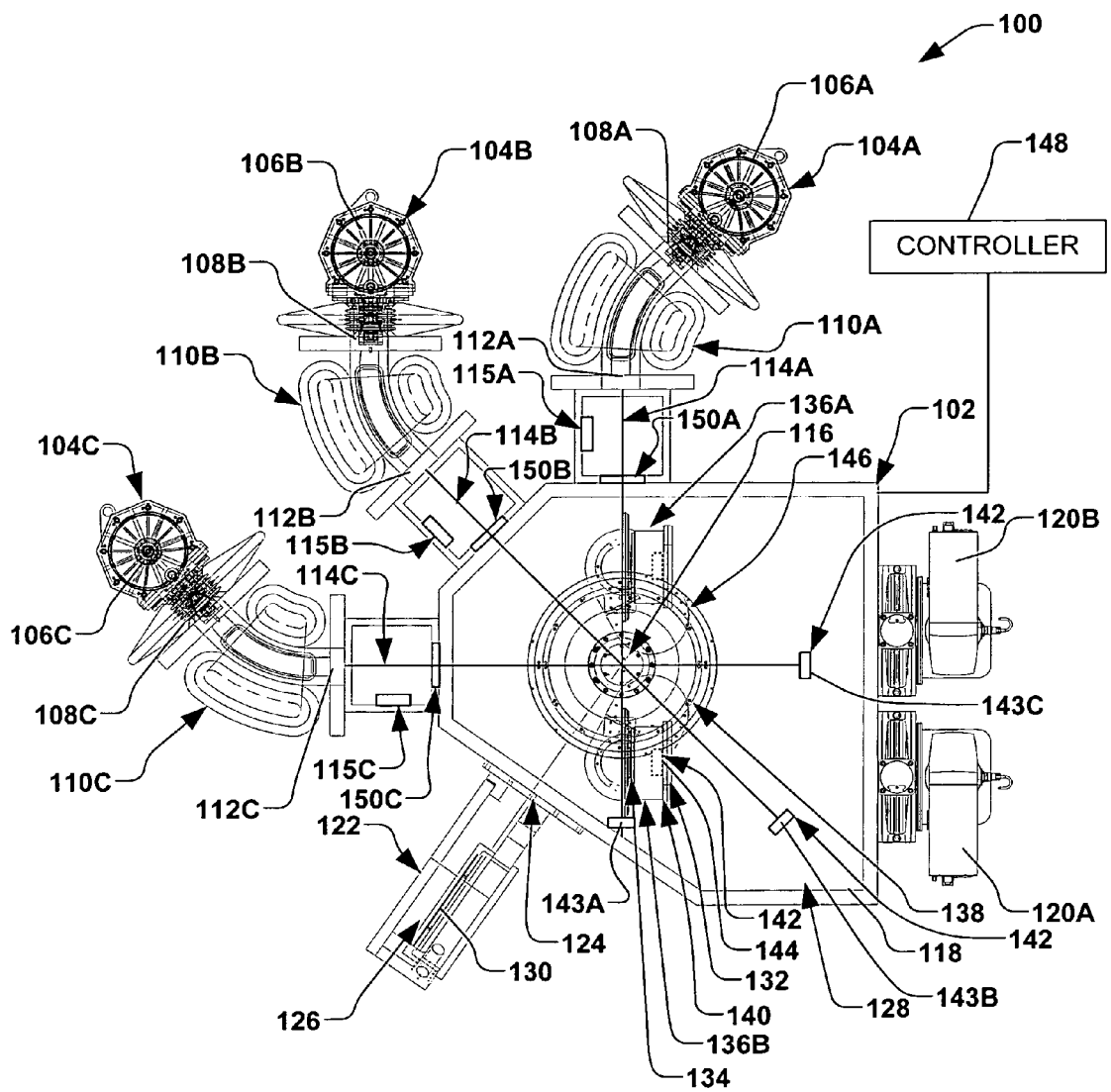
FIG. 2 illustrates an exemplary ion implantation cluster tool according to one aspect of the present invention.

Referring to the figures, in accordance with the present invention, FIG. 2 illustrates a plan view of an exemplary ion implantation cluster tool 100. The ion implantation cluster tool 100 comprises a common process chamber 102, wherein a plurality of ion beamline assemblies 104A-104C are operably coupled thereto. It should be noted that, while three ion beamline assemblies 104A-104C are illustrated, any number of ion beamline assemblies 104 greater than one may be coupled to the common process chamber, and are thus contemplated as falling within the scope of the present invention. Each ion beamline assembly 104, for example, comprises an ion source 106, an extraction assembly 108 (e.g., an extraction electrode or extraction optics), a mass analyzing magnet 110, and an exit or mass resolving aperture 112, wherein each ion beamline assembly is operable to produce a distinct beam of ions 114A-114C (e.g., a "beamline"). Each beamline assembly 104A-104C, for example, may further comprise a tuning Faraday 115A-115C for tuning of the respective beamline 114A-114C upstream of the common process chamber 102. The beamline 114A-114C produced by each ion beamline assembly 104A-104C may take the cross-sectional shape of a generally elongate ribbon beam, a spot or pencil beam, or a scanned beam that is electromagnetically or electrostatically scanned via the respective beamline assembly. Each beamline assembly 104A-104C, for example, may have a unique ion species respectively associated therewith, wherein a variety of differing doping processes can be performed via the cluster tool 100.

It should be noted that the plurality of ion beamline assemblies 104 may be configured to provide any combination of one or more of the above-described beamline shapes and ion species. For example, beamline assemblies 104A and 104B may be configured to produce ribbon beamlines of a single ion species, while beamline assembly 104C may be configured to produce a scanned pencil beam of a differing ion species. Accordingly, the present invention is not limited by the shape of the ion beam provided by the plurality of beamline assemblies 104, and any beamline shape or method of scanning said beamline is contemplated as falling within the scope of the present invention. Regardless of the shape or configuration of the plurality of beamlines 114A-114C, each beamline intersects a processing region 116 of the common process chamber, as will be discussed in further detail infra.

The common process chamber 102 of the present invention, for example, comprises a central vacuum chamber 118 that is in fluid communication with one or more vacuum pumps 120A-120B (e.g., a cryogenic pump), wherein the one or more vacuum pumps are operable to substantially evacuate the central vacuum chamber. The ion implantation cluster tool 100 further comprises a load lock chamber 122 operably coupled to the common process chamber 102 via one or more gate valves 124, wherein an interior environment 126 of the load lock chamber is operable to selectively communicate with a vacuum environment 128 within the common process chamber. The load lock chamber 122, for example, may be utilized to transfer one or more workpieces 130 (e.g., a semiconductor substrate or wafer) into or out of the common process chamber 102, as will be discussed hereafter.

In accordance with one exemplary aspect of the present invention, the ion implantation cluster tool 100 further comprises a scanning apparatus 132 generally positioned within the common process chamber 102, wherein the scanning apparatus is operable to hold and translate the workpiece 130 in one or more directions. For example, the scanning apparatus 132 comprises a workpiece holder 134 (e.g., an electrostatic chuck) for holding the workpiece 130, wherein the scanning apparatus is operable to selectively translate the workpiece holder, and hence, the workpiece, in one or more directions through the plurality of ion beamlines 114A-114C within the processing region 116 of the common process chamber 102.

In the present example, the workpiece holder 134 is illustrated as translating between a first position 136A and a second position 136B relative to the beamline 114C. It should be noted that an angle of incidence (e.g., a "tilt angle") formed between each of the plurality of beamlines 114A-114C and the workpiece 130 can be selectable for each respective beamline, wherein the scanning apparatus 132 is further operable to maintain a constant focal scanning of the workpiece with respect to the respective beamline. An exemplary scanning apparatus 132 is described in U.S. Pat. No. 6,900,444 issued to Axcelis Technologies, Inc. of Beverly, Mass., the contents of which are incorporated herein by reference.

The scanning apparatus 132, for example, is further operable to translate the workpiece 130 between the load lock chamber 122 and the processing region 116 within the central process chamber 102. The scanning apparatus 132 may comprise a central robot 138 having at least three degrees of freedom. In another example, the scanning apparatus 132 comprises a two-dimensional scanning system 140 operable to translate the workpiece holder 134 in two generally orthogonal axes with respect to each of the plurality of ion beamlines 114A-114C within the processing region 116. For example, the central robot 138 is operable to respectively position the workpiece holder 134 such that the workpiece 130 is generally orthogonal to each beamline 114A-114C, wherein the two-dimensional scanning system 140 is further operable to translate the workpiece holder along two generally orthogonal axes with respect to the beamline, thus providing a two-dimensional scanning of the workpiece through the respective beamline. In another example, the central robot 138 is operable to translate the workpiece 130 between the load lock chamber 122 and the processing region 116, as well as scan the workpiece holder 134 (and hence, the workpiece 130) in two generally orthogonal axes through each respective beamline 114A-114C.

In accordance with another exemplary aspect of the invention, the ion implantation cluster tool 100 comprises a dosimetry apparatus 142 is associated with the common process chamber 102, wherein the dosimetry apparatus is operable to measure one or more properties (e.g., beam current) of each of the plurality of ion beamlines 114A-114C. The dosimetry apparatus 142, for example, may comprise a Faraday cup 143A-143C associated with each respective beamline 114A-114C, wherein each Faraday cup is operably coupled to the common process chamber 102. In another example, the dosimetry apparatus 142 may comprise a Faraday cup 144 operably coupled to the scanning apparatus 132, wherein the scanning apparatus is further operable to selectively translate the dosimetry apparatus through the plurality of beamlines 114A-114C.

According to another example, a workpiece handling apparatus 146 is provided, wherein the workpiece handling apparatus is operably coupled to the common process chamber 102, and wherein the workpiece handling apparatus is configured to transfer a workpiece between the workpiece holder 134 of the scanning apparatus 132 and the load lock chamber 122. The workpiece handling apparatus 142, for example, may be integral to the scanning apparatus 132 (e.g., the central robot 136), or alternatively, may be another robot or translation mechanism (not shown) operable to transfer the workpiece 130 between the load lock chamber 122 and the workpiece holder 134 coupled to the scanning apparatus 132.

As stated above, the ion implantation cluster tool 100 of the present invention advantageously provides the plurality of beamline assemblies 104A-104C situated about the common process chamber 102, such that the respective beamlines 114A-114C intersect the processing region 116, wherein the workpiece 130 is implanted with ions of the respective beamline. For example, the plurality of beamlines 114A-114C intersect one another at a target location 148 within the processing region 116, wherein the workpiece 130 can be respectively positioned generally orthogonally to each of the plurality of beamlines at the target location. Accordingly, efficiencies are introduced that have previously been lacking. For example, the scanning apparatus 132 is common to all beamline assemblies 104A-104C, such that the workpiece holder 134 can be appropriately positioned for implantation by the respective beamline 114A-114C. Further, the dosimetry apparatus 142 is common to all beamline assemblies 104A-104C, such that the dosimetry apparatus is operable to characterize all beamlines 114A-114C when appropriately positioned by the scanning apparatus 132. Still further, a common controller 148 may be configured to control the ion implantation cluster tool 100 by controlling the beamline assemblies 104A-104C, and scanning apparatus 132. The common controller 148 may also provide feedback control via the dosimetry apparatus 142 for control of each beamline assembly 104A-104C, and may further control handling of the workpiece 130 via control the scanning apparatus 132 (e.g., control of the central robot 138 transferring the workpiece between the vacuum environment 128 within the common process chamber 102 and the load lock chamber 122).

Another efficiency introduced by the present invention is a potential redundancy in beamline assemblies, such that two or more beamline assemblies (e.g., beamline assemblies 104A and 104B) can be configured to provide the same species and type of ion beam, wherein in the case of one beamline assembly (e.g., beamline assembly 104A) failing or needing maintenance, the other redundant beamline assembly (e.g., beamline assembly 104B) can be quickly utilized for implants, thus decreasing potential process downtime.

In accordance with another exemplary aspect of the invention, each of the plurality of beamline assemblies 104A-104C comprises a respective gate valve 150A-150C, wherein the gate valves are operable to selectively isolate the plurality of beamline assemblies from the common process chamber 102. For example, when a species of ion associated with the beamline assembly 104C is desired, gate valves 150C is opened, and gate valves 150A and 150B are closed, such that the beamline assemblies 104A and 104B are substantially isolated from the vacuum environment 128 of the common process chamber 102. This, for example, may permit maintenance to be performed on beamline assemblies 104A and 104B while beamline assembly 104C continues to implant ions into the workpiece 130. Furthermore, the gate valves 150A-150C provide an environmental barrier between beamline assemblies 104A-104C, such that cross-contamination between beamline assemblies is minimized.

Accordingly, the present invention provides an efficient ion implantation cluster tool 100, wherein costs of ownership are generally decreased as compared to conventional systems, and productivity and efficiency is advantageously increased by utilizing common components. Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. An ion implantation cluster tool, comprising:
   a plurality of ion beamline assemblies having a respective plurality of ion beamlines associated therewith;
   a common process chamber, wherein each of the plurality of ion beamlines intersect at a processing region of the common process chamber;
   a scanning apparatus positioned within the common process chamber, wherein the scanning apparatus comprises a workpiece holder, and wherein the scanning apparatus is operable to selectively translate the workpiece holder in one or more directions through the plurality of ion beamlines within the processing region;
   a dosimetry apparatus associated with the common process chamber, wherein the dosimetry apparatus is operable to measure one or more properties of each of the plurality of ion beamlines; and
   a load lock chamber operably coupled to the common process chamber.

2. The ion implantation cluster tool of claim 1, further comprising a workpiece handling apparatus generally residing within the common process chamber, wherein the workpiece handling apparatus is configured to transfer a workpiece between the workpiece holder and the load lock chamber.

3. The ion implantation cluster tool of claim 1, wherein the plurality of ion beamline assemblies are positioned about a periphery of the common process chamber, and wherein the plurality of beamlines intersect one another at a target location within the processing region.

4. The ion implantation cluster tool of claim 1, wherein the common process chamber is operably coupled to one or more vacuum pumps, and wherein the one or more vacuum pumps are operable to provide a substantially evacuated environment within the common process chamber.

5. The ion implantation cluster tool of claim 1, further comprising a plurality of gate valves associated with the respective plurality of ion beamline assemblies, wherein the plurality of gate valves are operable to selectively isolate each of the respective plurality of beamline assemblies from the common process chamber.

6. The ion implantation cluster tool of claim 1, wherein the scanning apparatus comprises a central robot having at least three degrees of freedom.

7. The ion implantation cluster tool of claim 1, wherein the scanning apparatus comprises a two-dimensional scanning system operable to translate the workpiece holder in two generally orthogonal axes with respect to each of the plurality of ion beamlines within the processing region.

8. The ion implantation cluster tool of claim 1, wherein the dosimetry apparatus comprises a Faraday cup associated with each of the plurality of ion beamline assemblies, wherein each Faraday cup is operably coupled to the common process chamber.

9. The ion implantation cluster tool of claim 1, wherein the dosimetry apparatus is operably coupled to the scanning apparatus, wherein the scanning apparatus is operable to selectively translate the dosimetry apparatus through the plurality of beamlines.

10. The ion implantation cluster tool of claim 1, wherein each ion beamline assembly comprises an ion source, extraction assembly, mass analyzer, mass resolving aperture, and tuning Faraday.

11. The ion implantation cluster tool of claim 1, wherein one or more of the plurality of beamline assemblies are configured to form a ribbon ion beam.

12. The ion implantation cluster tool of claim 1, wherein each of the plurality of beamline assemblies comprises a tuning faraday positioned upstream of the common process chamber.

13. The ion implantation cluster tool of claim 1, wherein each of the plurality of beamline assemblies has unique ion species associated therewith.

14. An ion implantation system, comprising:
a common process chamber;
a load lock chamber operably coupled to the common process chamber;
a plurality of ion beamline assemblies positioned about a periphery of the common process chamber and operably coupled thereto, wherein each of the plurality of ion beamline assemblies is configured to provide a respective ion beamline directed toward a processing region of the common process chamber;
a workpiece handling apparatus generally positioned within the common process chamber, wherein the workpiece handling apparatus comprises a workpiece holder operable to hold a workpiece, wherein the workpiece handling apparatus is operable to translate the workpiece through each of the plurality of ion beamlines, and wherein the workpiece handling apparatus is further operable to translate the workpiece between the process chamber and the load lock chamber;
a common dosimetry apparatus associated with the workpiece handling apparatus, wherein the common dosimetry apparatus is operable to measure one or more characteristics of each of the plurality of ion beamlines; and
a controller configured to control each of the plurality of ion beamline assemblies.

15. The ion implantation system of claim 14, wherein each of the plurality of ion beamlines intersect at the processing region of the process chamber.

16. The ion implantation system of claim 14, wherein the controller is further operable to control the plurality of beamline assemblies based on the one or more characteristics measured by the common dosimetry apparatus.

17. The ion implantation system of claim 14, wherein the common dosimetry apparatus comprises a Faraday cup associated with each of the plurality of ion beamline assemblies, wherein each respective Faraday cup is operably coupled to the common process chamber.

18. The ion implantation system of claim 14, further comprising a plurality of selectively gate valves associated with the respective plurality of ion beamline assemblies, wherein the plurality of gate valves are operable to selectively isolate each of the respective plurality of beamline assemblies from the common process chamber.

19. The ion implantation system of claim 14, wherein one or more of the plurality of beamline assemblies comprises a ribbon beam ion implanter.

20. The ion implantation system of claim 14, wherein each of the plurality of beamline assemblies comprises a tuning Faraday positioned upstream of the common process chamber.

* * * * *